United States Patent
Pfeifer et al.

(10) Patent No.: US 7,068,507 B2
(45) Date of Patent: Jun. 27, 2006

(54) COMPACT LIQUID CONVERTER ASSEMBLY

(75) Inventors: David W. Pfeifer, Piper Pike, OH (US); John Kasunich, Mayfield Heights, OH (US); Richard Sheppard, Mentor, OH (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 82 days.

(21) Appl. No.: 10/260,064

(22) Filed: Sep. 27, 2002

(65) Prior Publication Data
US 2006/0007720 A1   Jan. 12, 2006

(51) Int. Cl.
*H05K 7/20* (2006.01)

(52) U.S. Cl. .............. 361/699; 361/707; 361/719; 165/80.4; 165/104.33; 174/15.1

(58) Field of Classification Search ........... 361/689, 361/690, 698, 699, 700, 702, 703, 704; 257/714, 257/715; 174/15.1, 15.2; 165/80.3, 80.4, 165/104.33, 122
See application file for complete search history.

(56) References Cited

U.S. PATENT DOCUMENTS

| | | | |
|---|---|---|---|
| 3,776,305 A | 12/1973 | Simmons | |
| 4,093,024 A | 6/1978 | Middleton | |
| 4,392,153 A | 7/1983 | Glascock, II et al. | |
| 4,635,709 A | 1/1987 | Altoz | |
| 4,646,202 A | 2/1987 | Hook et al. | |
| 4,652,970 A | 3/1987 | Watari et al. | |
| 4,727,454 A | 2/1988 | Neidig et al. | |
| 4,727,455 A | 2/1988 | Neidig et al. | |
| 4,884,168 A | 11/1989 | August et al. | |
| 4,894,709 A | 1/1990 | Phillips et al. | |
| 4,998,181 A | 3/1991 | Haws et al. | |
| 5,199,487 A | 4/1993 | DiFrancesco et al. | |
| 5,271,455 A | 12/1993 | Semple | |
| 5,365,424 A | 11/1994 | Deam et al. | |
| 5,579,217 A | 11/1996 | Deam et al. | |
| 5,623,399 A | 4/1997 | Ishii et al. | |
| 5,631,821 A | 5/1997 | Muso | |
| 5,636,684 A | 6/1997 | Teytu et al. | |
| 5,719,444 A | 2/1998 | Tilton et al. | |
| 5,804,761 A * | 9/1998 | Donegan et al. | 174/15.1 |

(Continued)

FOREIGN PATENT DOCUMENTS

| | | |
|---|---|---|
| JP | 04002156 A | 1/1992 |
| JP | 2002098454 A | 4/2002 |

*Primary Examiner*—Boris Chérvinsky
(74) *Attorney, Agent, or Firm*—Quarles & Brady, LLP; William R. Walbrun

(57) ABSTRACT

An electronic converter assembly including a liquid cooled heat sink member having a sink length dimension, at least one mounting surface and first and second oppositely facing lateral surfaces, the mounting surface and first and second lateral surfaces forming first and second lateral edges, respectively, the sink member also forming at least one internal channel that extends substantially along the entire sink length, an inlet and an outlet that open into opposite ends of the channel, a plurality of power switching devices mounted side by side to the mounting surface thereby forming a single device row that extends substantially along the sink length, each device including intra-converter terminals that are substantially within a single connection plane, a plurality of capacitors, each capacitor including capacitor connection terminals, the capacitors linked for support to and adjacent the sink member with the capacitor terminals juxtaposed substantially within the connection plane and a linkage assembly including a plurality of conductors that link the capacitor terminals to the intra-converter terminals to form a power conversion topology.

32 Claims, 9 Drawing Sheets

U.S. PATENT DOCUMENTS

| | | | |
|---|---|---|---|
| 5,814,909 A * | 9/1998 | Yamada et al. .............. 310/64 |
| 5,828,554 A | 10/1998 | Donegan et al. |
| 5,901,037 A | 5/1999 | Hamilton et al. |
| 5,915,463 A | 6/1999 | Romero et al. |
| 5,925,929 A | 7/1999 | Kuwahara et al. |
| 5,930,135 A | 7/1999 | Janko |
| 5,966,291 A * | 10/1999 | Baumel et al. ............. 361/707 |
| 5,978,220 A | 11/1999 | Frey et al. |
| 6,002,580 A | 12/1999 | LeVantine et al. |
| 6,031,751 A | 2/2000 | Janko |
| 6,137,169 A | 10/2000 | Pace |
| 6,166,937 A | 12/2000 | Yamamura et al. |
| 6,196,299 B1 | 3/2001 | Tustaniwskyj et al. |
| 6,219,245 B1 | 4/2001 | Nagashima et al. |
| 6,236,566 B1 * | 5/2001 | Regnier et al. ............. 361/699 |
| 6,326,761 B1 * | 12/2001 | Tareilus .................... 318/722 |
| 6,327,165 B1 | 12/2001 | Yamane et al. |
| 6,340,851 B1 | 1/2002 | Rinaldi et al. |
| 6,367,543 B1 | 4/2002 | Calaman et al. |
| 6,414,867 B1 * | 7/2002 | Suzuki et al. .............. 363/141 |
| 6,442,023 B1 * | 8/2002 | Cettour-Rose et al. ...... 361/690 |
| 6,529,394 B1 * | 3/2003 | Joseph et al. .............. 363/141 |
| 6,563,709 B1 | 5/2003 | Negishi et al. |
| 6,580,609 B1 | 6/2003 | Pautsch |
| 6,618,278 B1 | 9/2003 | Suzuki et al. |
| 6,729,383 B1 | 5/2004 | Cannell et al. |
| 2001/0040027 A1 | 11/2001 | Toovama et al. |
| 2002/0029876 A1 | 3/2002 | Fast |
| 2002/0043361 A1 | 4/2002 | Saito et al. |
| 2002/0162673 A1 | 11/2002 | Cook et al. |
| 2003/0036806 A1 | 2/2003 | Schienbein et al. |

* cited by examiner

COMPACT LIQUID CONVERTER ASSEMBLY

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

The field of the invention is power converters and more specifically converter configurations including heat sinks that reduce the overall space required to accommodate the configurations.

It is well known that variable speed drives of the type used to control industrial electric motors include numerous electronic components. Among the various electronic components used in typical variable-speed drives, all generate heat to a varying degree during operation. Typically, high-power switching devices such as IGBTs, diodes, SCRs and the like as well as storage devices such as capacitors are responsible for generating most of the heat in a variable-speed drive. It is for this reason, therefore, that most variable-speed drives include a heat sink(s) upon which the power switching devices are mounted. The heat sink(s) conducts potentially damaging heat from assembly components.

Selecting the size and design of a heat sink for a particular variable speed drive is somewhat of a challenge. First, a designer must be aware of the overall characteristics of the motor and drive pair. Second, the designer must understand the industrial application in which the motor and drive pair will be used, including the continuous and peak demands that will likely be placed on the motor and drive by the load. Third, the designer must accommodate, in the design, certain unexpected conditions that would deleteriously affect the heat transfer capability of the heat sink such as unexpectedly high ambient temperatures, physical damage to the heat sink such as mechanical damage, or a build up of a debris layer, as examples. Fourth, the heat sink(s) must be physically dimensioned so as to fit into the space allotted per customer requirements, cabinet or enclosure size, or the like.

In the past, air-cooled heat conducting plates were used to transfer thermal energy from electronic parts to the ambient air. These were passive heat-transfer devices and were generally formed of a light-weight aluminum extrusion including a set of fins. As a general rule, heat transfer effectiveness is based on the temperature differential between the power devices and the ambient air temperature. Of course, in order to provide adequate heat conduction, heat sinks of this type oftentimes are necessarily large and, therefore, bulky and expensive. If high ambient conditions exist, the heat sink becomes ineffective or useless as heat removal cannot be accomplished regardless of the size of the heat sink. If the variable speed drive was in an enclosed space the heat removed from the drive would need to be exhausted or conditioned for recirculation.

By forcing air over fins defined on the heat-conducting plate (e.g., an aluminum extrusion), improved cooling efficiency can be realized. Large blower motors are often used for this purpose. However, as the fins defined in the aluminum extrusions become dirty or corroded during use, the heat sinks become less effective or useless altogether. Blower motors cannot be used in environments where air cleanliness would clog filtration. Therefore, air conditioning equipment is often added to internally circulate and cool the air that is passed over the heat sink fins.

Liquid cooled heat sinks or cold plates have also been used for some applications but with limited success. Generally, a liquid cooled heat sink includes a series of chambers or channels that are formed internally within a sink body member that is formed of material (e.g., copper or aluminum) that readily conducts heat. The body member includes at least one mounting surface for receiving heat generating devices. The channels are typically configured so that at least one channel section is formed adjacent each surface segment to which a heat generating device is mounted—typical channel configurations are serpentine. A coolant liquid is pumped through the channels from one or more inlet ports to one or more outlet ports to cool the sink member and hence conduct heat away form the heat generating devices.

The industry has developed several ways in which to manufacture liquid cooled heat sinks and, each of the different ways to manufacture has different costs associated therewith. For instance, a liquid cooled sink can be constructed by forming a desired serpentine copper conduit path for liquid flow, placing the serpentine conduit construct within a sink mold, pouring molten liquid aluminum into the mold and allowing the molten aluminum to cool. While this manufacturing process has been used successfully, liquid molding processes are very difficult to control and the incidences of imperfect and or non-functioning product have been relatively high.

One other sink manufacturing process that has proven useful includes cutting a at least one channel out of a sink body member, hermetically sealing (e.g., vacuum brazing) a cover member to the body member to cover the channel and then forming an inlet and an outlet that open into opposite ends of the channel. This two part sealing process is much less expensive than the conduit-molten process described above.

When designing any liquid cooled heat sink several factors have to be considered including heat dissipating effectiveness, volume required to accommodate a resulting converter, and cost. With respect to heat dissipation, in the case of a power conversion assembly, there are typically several different heat generating devices that are similarly constructed and that operate in a similar fashion to convert power. For instance, as well known in the controls arts, an AC to DC rectifier typically includes a plurality of power switching devices that are arranged to form a bridge assembly. In the case of a three phase supply and load, the bridge assembly includes three phases, a separate switching phase for each of the three supply and load phases. Here, an exemplary phase may include first and second power switching devices linked at a common node to an associated supply line where the other terminals of the first and second switches are linked to positive and negative DC busses, respectively. A controller is configured to control all of the three phases of the bridge together to convert the three phase AC supply voltage to a DC potential across the positive and negative DC busses.

In a similar fashion, a three phase inverter assembly typically includes three separate phases that link positive and negative DC busses to three load supply lines. In the case of an inverter, each phase typically includes first and second power switching devices that are linked in series between the positive and negative DC busses with the common node between the first and second inverter switches linked to an associated phase of the load. Where the supply and load voltages are large, some rectifier/inverter converter assemblies may include several three phase bridges linked together thereby reducing the load handling of each switching device.

In the case of a rectifier-inverter conversion assembly, a drive circuit is provided that controls all of the switching devices together to create desired three phase output voltages to drive a load linked thereto. In this case, it is imperative that the switching devices operate in characteristic and substantially similar ways to simplify what is, by its very nature, an already complex switching scheme. For this reason, converter designers typically select switching devices having known operating characteristics to configure their conversion assemblies.

Nevertheless, as also well known, most switching devices have operating characteristics that are, at least in part, affected by the environments in which the devices operate. Specifically, for the purposes of the present invention, it should be appreciated that switching device operating characteristics change as a function of temperature. For instance, an internal switch resistance has been known to change as a function of temperature which in turn affects the voltage drop across the switch. While each voltage drop change that occurs may seem insignificant, because rectifier and inverter switches are typically turned on and off very rapidly, the affect of changing device drop has been shown to be appreciable.

The problems associated with voltage drop variance are compounded where similar switching devices are operated at different temperatures and is especially acute where control schemes operate to simultaneously control all three conversion assembly phases together to generate load voltages. Thus, for instance, where one switching device is several degrees hotter than another switching device, the result may be unbalanced phase voltages and hence imperfect load control (e.g., non-smooth motor rotation) which increases overall system wear and can cause system damage over time.

For this reason, one challenge when designing a heat sink for use with a converter assembly has been to provide essentially identical heat dissipating capacity to each converter switching device so that device temperatures are essentially identical during system operation. The problem here is that coolant temperature rises as the coolant absorbs heat along its path through a sink member so that power switching devices relatively near an inlet port along a serpentine coolant path are cooled to a greater degree than switching devices down stream from the inlet port. One solution that reduces the heat dissipating capacity differential between similar switching devices has been to provide a heat sink where the spacing between a cooling liquid inlet and each of the sink surfaces to which switching devices are mounted is similar. For instance, where a configuration includes twenty four power switching devices, instead of mounting the switching devices to the sink in a pattern that tracks a single serpentine cooling conduit path, the switching devices may be mounted on sink member mounting surface to form six rows of four switching devices each where each of the six rows is fed by a separate one of six liquid coolant inlet ports—here a manifold may serve each of the six inlet ports (see generally FIG. 23 in U.S. Pat. No. 6,031,751 (hereinafter "the '751 patent") entitled "Small Volume Heat Sink/Electronic Assembly" which issued on Feb. 29, 2000 and which is incorporated herein by reference). Thus, in this case, coolant from each of the six inlet ports passes by four separate heat generating devices and device cooling will be relatively more uniform. This solution to reduce the device temperature differential will be referred to hereinafter as a matrix spacing solution.

One other solution that reduces the heat dissipating capacity differential between switching devices mounted to a sink member has been to provide a serpentine path that passes by each heat generating device more than once so that the overall cooling affect of devices is similar. For instance, assume twelve switching devices are mounted to a sink member mounting surface to form two rows of six devices each and that a single serpentine path is configured to include a first linear run that passes adjacent the first row of devices, a first 180 degree turn, a second linear run that passes adjacent the second row of devices, a second 180 degree turn, a third linear run that again passes adjacent the second row of devices, a third 180 degree turn and a fourth linear run that passes a second time by the first row of devices to an outlet.

Here, in theory, the first linear run should include the coolest coolant, the second linear run should include the second coolest coolant and so on so that the coolant temperatures through the first and fourth linear runs (i.e., adjacent the devices in the first row) should average and the coolant temperatures though the second and third linear runs (i.e., adjacent the devices in the second row) should also average and the two average temperatures should be similar (see generally FIG. 2 in the '751 patent). This solution to reduce the device temperature differential will be referred to hereinafter as an averaging solution.

While the averaging solution and the matrix spacing solution work in theory, in reality, each of these solutions have had some problems regarding temperature differential. With respect to the matrix spacing solution, in the example above, the fourth device along each of the six separate coolant paths is warmer than the first device along the same path as liquid passing by the first three devices along the path heats up when heat is absorbed along the path. Thus, while better than sinks that align devices along a single serpentine cooling conduit path, the matrix solution still results in a temperature differential.

With respect to the averaging solution, it has been determined that, despite multi-pass designs, at least some temperature differential still exists between devices spaced at different locations along the coolant conduit path. In addition, in some cases, cooling capacity may vary over the heat dissipating surface of each heat generating device. This intra-device dissipating differential may occur as a multi pass path necessarily requires that the coolest pass (i.e., the first pass by a device) be positioned along one side of a dissipating surface so that another one or more passes that include relatively warmer coolant can be positioned along the other side of the dissipating surface.

With respect to volume (i.e., the second factor above to consider when designing a heat sink), as with most electronics designs, all other things being equal, smaller is typically considered better. Thus, some prior converter configurations have provided sink members that either facilitate stacking of relatively short devices adjacent elongated devices (see FIG. 19 in the '751 patent) or, in the alternative, aligning similar dimensions of different devices (see FIG. 13 in the '751 patent).

For instance, the '751 patent recognizes that, in addition to power switching devices, converter configuration capacitors also often generate excessive heat that should be dissipated to ensure proper operation. The '751 patent also recognizes that capacitors typically have a length dimension perpendicular to their heat dissipating surface that is much longer than the thickness dimensions of typical switching devices perpendicular to the device dissipating surfaces and that the switching devices typically have a length dimension that is similar to the capacitor length dimension. In this case, in one embodiment, the '751 patent recognizes that overall converter configuration size can be reduced by providing an L shaped sink member having two legs that form a 90° angle, mounting the capacitors to an inside surface of one of the legs and within the space defined by the two leg members and mounting the switching devices to the outside surface of the other of the leg members thereby aligning the similar capacitor and device length dimensions.

With respect to cost, unfortunately, where an L shaped heat sink member or, for that matter, where a sink member having sections that reside along other than a single plane is required to stack or align capacitors with switching devices, the relatively inexpensive two part sealing process described above becomes much more difficult to use. This is because the two part sealing process generally includes vacuum sealing a flat cover member over a channel forming body member. When the channel must reside in more than one plane and requires a more complex cover member, tolerances required to provide a suitable cover member would be extremely difficult to meet and the sealing process would be difficult to perform effectively.

Thus, where the sink member must reside in two or more planes to facilitate stacking and/or aligning, the more expensive molten-conduit process would likely be employed where the conduit is formed into the desired channel shape and molten aluminum or the like is poured into a mold there around. For this reason prior stacking and aligning configurations have proven to be relatively expensive to manufacture and often are not suitable given cost constraints.

Also, with respect to cost, often the last converter design consideration is how system components will be electrically linked together to form a converter topology. One particularly advantageous and robust type of linking assembly is referred to generally as a laminated bus bar. As its label implies, a laminated bus bar typically includes a plurality of metallic sheets of laminate that are layered together with insulators between adjacent laminate sheets. Vias are formed within the laminated assembly where links are to be made to capacitor and switching device terminals. The vias automatically link the devices and capacitors up in a desired fashion to provide an intended converter topology (e.g., rectifier, inverter, rectifier-inverter, etc.).

Laminated bus bar cost is generally a function of the amount of material required to construct the bus, the number of laminate layers required to support a configuration and the overall complexity of the required laminate member where minimal material, minimal layers and minimal contours (i.e., bends in the laminates) are all advantageous. Unfortunately, providing a configuration that uses minimal laminate material, requires minimal layering and restricts the laminate to a single plane is extremely difficult given the sink member configurations required to minimize overall configuration size and provide essentially uniform heat dissipating capacity to all switching devices mounted to the sink. For example, where devices are arranged in rows and columns to provide similar distances between channel inlets and devices down stream therefrom, typically a large number of laminate layers and a correspondingly complex labyrinth of vias are required to link components together. As another instance, where switching device lengths are aligned with similarly dimensioned capacitor lengths the lamination bus typically requires one or, more often, several bends to accommodate connection terminals that reside in disparate planes. In either of these two cases (i.e., many layers or several laminate bends) the amount of material required to configure a laminated bus bar can be excessive and hence unsuitable for certain applications.

Yet one other cost consideration related to converter configurations has to do with component versatility or the ability to use converter components in more than one converter configuration. Component versatility is particularly important with respect to the more expensive component types such as, for example, the heat sink assembly, the laminated bus bar, etc. In this regard, overall system costs can be reduced by designing sinks and laminated bus bars that can be used with various device and capacitor types. For instance, assume that a first converter configuration includes a first type of switching device, a first type of capacitor, a first type of sink member and a first type of laminate bar. Also assume that the sink, devices and a capacitors are dimensioned such that when the capacitors and devices are mounted to the sink, the capacitors connection terminals are on the same plane as the device connection terminals. Here, the first laminate bus bar type can be planar and hence relatively.

Next assume that a designer wants to swap out a second capacitor type for the first type in the configuration where the second capacitor type has a thickness between its dissipating surface and its connection terminals that is different than a similarly measures thickness of the first capacitor type. In this case, when the capacitors are swapped, the capacitor and device terminals will no longer reside within the same plane and a different, perhaps custom designed, laminate will be required to accommodate the change. In the alternative, the sink design may be altered to accommodate the change in device and capacitor terminal planes although this solution would be relatively expensive. Similar problems occur when different switching devices are swapped into configurations.

Thus, it would be advantageous to have a heat sink assembly that is relatively inexpensive to manufacture and yet provides substantially similar heat dissipating capacity to all devices mounted thereto. In addition, it would be advantageous if a sink assembly of the above kind could be used with a simplified laminate design and be used to configure relatively compact converter assemblies. Moreover, it would be advantageous if the sink assembly could be versatile and hence used with other converter components that have many different dimensions.

BRIEF SUMMARY OF THE INVENTION

It has been recognized that relatively compact and inexpensive converter configurations can be configured by using an elongated liquid cooled heat sink to cool power switching devices. More specifically, it has been recognized that, where switching devices are mounted in a single row to a sink member mounting surface, the sink can be used to configure minimal volume converter configurations. In at least one embodiment of the invention, the sink mounting surface has a width dimension that is substantially similar to a width dimension of switching devices to be mounted thereto with the device width dimensions aligned with the mounting surface width dimension. This single row limitation has several configuration advantages described below.

It has also been recognized that, with certain types of refrigerant, the cooling capacity differential along a cooling channel appears to be exacerbated along the channel length. For instance, the cooling capacity differential appears to be relatively pronounced in the case of two phase refrigerants such as R-134a and R-123. As the label implies, two phase refrigerants change from a liquid to a gas when heat is absorbed and hence, generally, absorb a greater amount of heat, due to the endothermic nature of the phase change, than conventional single-phase liquid refrigerants such as water—hence two phase refrigerants are generally preferred in high efficiency heat sinks.

Moreover, it has been recognized that, unfortunately, as two-phase refrigerants absorb heat and change phase from liquid to gas, vapor bubbles are formed within the liquid that accumulate on the internal surfaces of the heat sink and form gas pockets. The gas pockets on the surface of the channel block refrigerant from contacting the channel surface and hinder device heat absorption by the refrigerant. Thus, the channel surfaces on which gas pockets form end up becoming hot spots on the channel surfaces and the temperatures of devices attached adjacent thereto rise.

Because the vapor bubbles are formed by heat absorption and because coolant relatively further down stream from an inlet is warmer than coolant more proximate the inlet, relatively more vapor bubbles are formed down stream from the inlet than proximate the inlet thereby causing more gas pockets to form down stream which increases the temperature differential along the channel length. Thus, it has been determined that, while coolant temperature accounts for some of the temperature differential along a coolant channel length, much of the temperature differential is actually due to different amounts of gas accumulating along different sections of the channel—the gas having an insulating effect between the channel surfaces and the coolant passing thereby. Based on these realizations it should be appreciated that the temperature differential problem is exacerbated where sink channels are extended.

According to several embodiments of the invention, protuberances of a character, quantity and size that increase turbulence within sink channels to a point where the turbulence either prohibits gas pockets from forming on the channel surfaces or dislodges or breaks up gas pockets that form on the channel surfaces, are provided on at least one of the channel surfaces. It has been found that when such protuberances are provided within a channel, the channel can have an extended length without causing excessive temperature differentials there along. More specifically, it has been determined that the channel length can, in at least one embodiment, extend substantially along an entire sink length where the sink, as indicated above, has a length to accommodate a single row of switching devices. For instance, where a converter configuration includes twenty four switching devices, the twenty four devices can be arranged in a single row along the sink member mounting surface where the channel extends along substantially the entire sink length from an inlet to an outlet.

It has also been determine that, in at least some embodiments of the invention, the sink member can be juxtaposed so that the channel inlet is below the channel outlet and, more specifically, so that the channel inlet is directly vertically below the channel outlet. Here, dislodged or broken up gas pockets, being lighter than the refrigerant, are aided by buoyancy in their movement toward the outlet at the top of the sink channel.

By providing an elongated sink-device assembly including devices mounted in a single row to an elongated sink member, overall converter cost can be reduced. In this regard, the single channel sink member can be manufactured using the two piece sealing method described above where the channel is bore out of a body member, a cover member is hermetically sealed over the channel and inlet and outlet ports that open into the channel are formed.

In addition, cost is reduced with the inventive elongated sink-device assembly as a simplified laminated bus bar can be used with the sink-device assembly. In this regard, where capacitors are juxtaposed to one side of the switching devices and with capacitor terminals and device terminals positioned within a common connection plane, the distances between capacitor terminals and the device terminals that the capacitor terminals are to be linked to are reduced appreciably so that less material is required to make terminal connections. Moreover, because capacitor terminals and the device terminals to which the capacitor terminals are to be linked may be positioned proximate each other, none of the laminates have to pass over other devices disposed intermediate the connecting terminals and therefore simpler laminate and associated via designs can be employed that include relatively small numbers (e.g., 3) of laminate layers.

Consistent with the above, at least one embodiment of the invention includes an electronic converter assembly comprising a liquid cooled heat sink member having a sink length dimension, at least one mounting surface and first and second oppositely facing lateral surfaces, the mounting surface and first and second lateral surfaces forming first and second lateral edges, respectively, the sink member also forming at least one internal channel that extends substantially along the entire sink length, an inlet and an outlet that open into opposite ends of the channel, a plurality of power switching devices mounted side by side to the mounting surface thereby forming a single device row that extends substantially along the sink length, each device including intra-converter terminals that are substantially within a single connection plane, a plurality of capacitors, each capacitor including capacitor connection terminals, the capacitors linked for support to and adjacent the sink member with the capacitor terminals juxtaposed substantially within the connection plane and a linkage assembly including a plurality of conductors that link the capacitor terminals to the intra-converter terminals to form a power conversion topology.

In one embodiment each power switching device includes first and second oppositely facing linking edges and wherein the intra-converter terminals form the first linking edge proximate the first lateral edge of the sink member.

Some embodiments further include a bracket member mounted to the sink member and extending past the first surface, the capacitors mounted to the bracket member for support. More specifically, the mounting surface may be a first mounting surface and the sink member may include a second mounting surface that faces in a direction opposite the first mounting surface wherein the bracket member is mounted to the second mounting surface.

In some embodiments the bracket member includes a proximate member mounted to the second mounting surface, an intermediate member linked to and forming a substantially 90 degree angle with the proximate member and extending substantially parallel to the first lateral side of the sink member and generally away from the sink member and a distal member forming a substantially 90 degree angle with the intermediate member and extending generally away from the sink member, the capacitors mounted to the distal member. Moe specifically, in one embodiment each of the devices includes a heat dissipating surface adjacent the mounting surface and is characterized by a device thickness dimension between the connection plane and the dissipating surface of the device, the first and second mounting surfaces are separated by a sink thickness, the intermediate member has an intermediate member length, each capacitor includes first and second oppositely facing ends and a length dimension between the first and second ends, the capacitor terminals extend axially from the first end of each capacitor and the second end of each capacitor is mounted to the distal member and, wherein, the combined sink thickness, device thickness and intermediate member length is substantially similar to the capacitor length dimension.

Each capacitor may have a heat conducting extension that protrudes from the second end of the capacitor and that is in conductive contact with the distal end of the bracket member. Here, the bracket member may be formed of a heat conducting material (e.g., aluminum or copper). In addition, here, the linkage assembly may include a substantially planar laminated bus bar.

In some embodiments the linkage assembly links the capacitors and power switching devices together to form an inverter while in other embodiments the linkage assembly may link the capacitors and switching devices to form a rectifier. In still other embodiments the linage assembly may link the capacitors and switching devices to form both a rectifier and an inverter.

The first and second lateral edges of the mounting surface may form a sink member width and a device width between the first and second linking edges may be substantially similar to the sink member width.

In some embodiments the channel inlet is disposed below the channel outlet. More specifically, the channel inlet is substantially directly vertically below the channel outlet. In some embodiments the extension members may be provided that extend into the channel thereby increasing turbulence in liquid pumped from the inlet to the outlet.

The invention also includes an electronic converter assembly comprising a heat sink member having a sink length dimension, at least one mounting surface and first and second oppositely facing lateral surfaces, the mounting surface and first and second lateral surfaces forming first and second lateral edges, respectively, a plurality of power switching devices mounted side by side to the mounting surface to form a single device row that extends along the sink length, each device including intra-converter terminals juxtaposed substantially within a single connection plane, each device also including first and second oppositely facing linking edges having a device width therebetween, a bracket member mounted to the sink member and extending past the first lateral surface, a plurality of capacitors, each capacitor including capacitor connection terminals, the capacitors mounted to the bracket member adjacent the sink member with the capacitor terminals substantially within the connection plane and a linkage assembly including a plurality of conductors that link the capacitor terminals to the intra-converter terminals to form a power conversion topology.

In some embodiments the sink member forms at least one internal channel that extends substantially along the entire sink length and an inlet and an outlet that open into opposite ends of the channel and, wherein, the converter configuration is juxtaposed so that the channel is substantially vertically oriented. More specifically, the channel inlet may be substantially vertically below the channel outlet.

These and other objects, advantages and aspects of the invention will become apparent from the following description. In the description, reference is made to the accompanying drawings which form a part hereof, and in which there is shown a preferred embodiment of the invention. Such embodiment does not necessarily represent the full scope of the invention and reference is made therefore, to the claims herein for interpreting the scope of the invention.

BRIEF DESCRIPTION OF THE SEVERAL VIEWS OF THE DRAWINGS

FIG. 1a is a schematic diagram of a rectifier configuration and corresponding controller while

DETAILED DESCRIPTION OF THE INVENTION

Figure 1A:
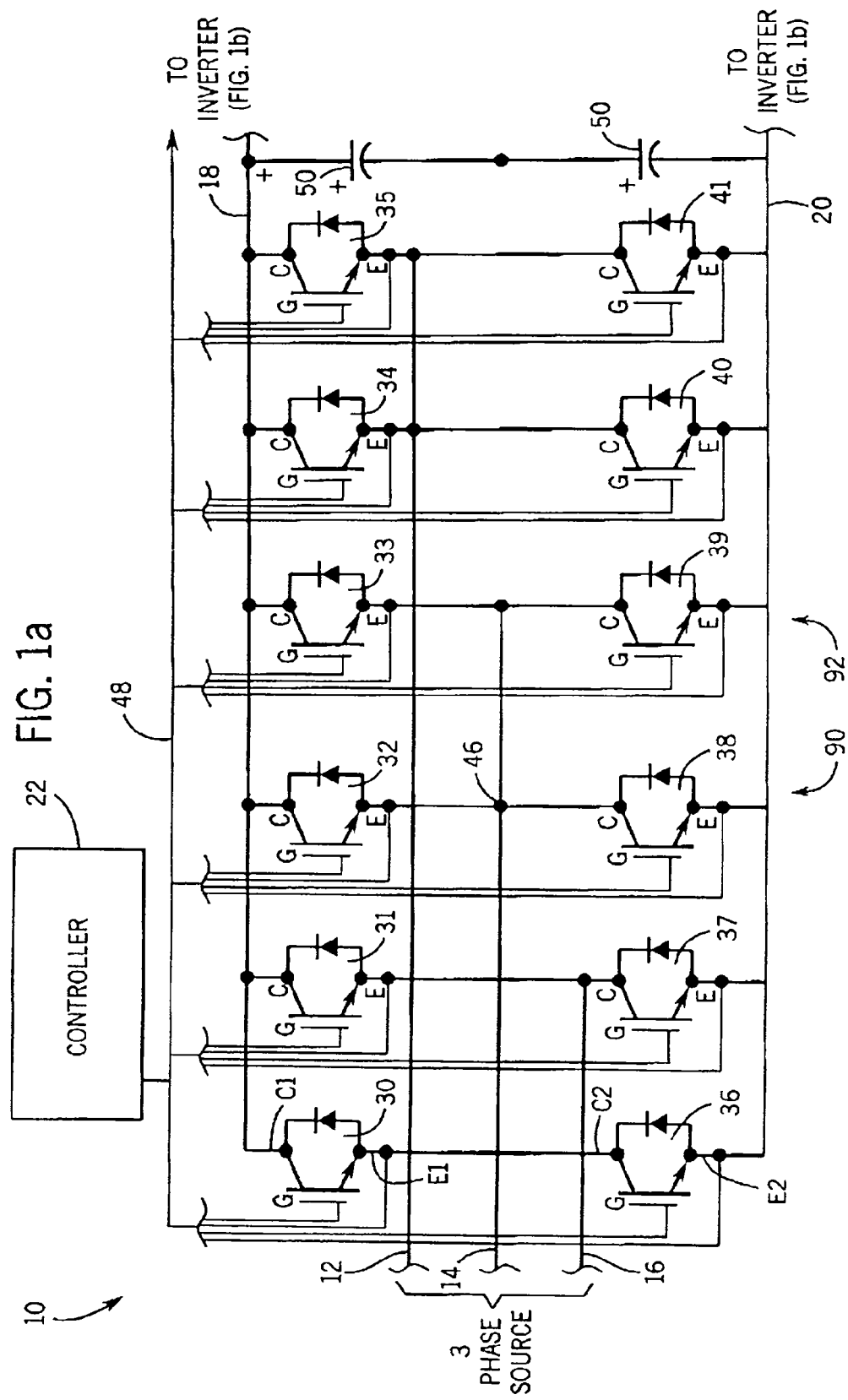

Referring now to the drawings where in like numerals correspond to similar elements throughout the several views and, more specifically, referring to FIGS. 1a and 1b, the present invention will be described in the context of exemplary motor control system 10 including a rectifier assembly generally illustrated in FIG. 1a which feeds an inverter assembly generally illustrated in FIG. 1b where each of the rectifier and inverter are controlled by a controller 22. As known in the controls industry, rectifier (FIG. 1a) receives three-phase AC voltage on input lines 12, 14 and 16 and converts that three-phase voltage to a DC potential across positive and negative DC buses 18 and 20, respectively. The DC buses 18 and 20 generally feed the inverter configuration (see again FIG. 1b) which converts the DC potential to three-phase AC voltage waveforms that are provided to a three-phase load via first, second and third inverter output lines 24, 26 and 28, respectively.

The rectifier assembly includes twelve separate switching devices identified by numerals 30–41. The switching devices 30–41 are arranged between the positive and negative DC buses 18 and 20, respectively, to provide six separate rectifier legs. Each rectifier leg includes two series connected switching devices that traverses the distance between the positive and negative DC buses 18 and 20, respectively. For example, a first rectifier leg includes switches 30 and 36 that are in series between positive bus 18 and negative bus 20, a second rectifier leg includes switches 31 and 37 that are series connected between buses 18 and 20, a third rectifier leg includes switches 32 and 38 that are series connected between buses 18 and 20, and so on. The nodes between switches in each rectifier leg are referred to as common nodes. One common node between switches 32 and 38 is identified by numeral 46.

Each of input lines 12, 14 and 16 is separately linked to two different common nodes. For example, as illustrated, line 14 is linked to common node 46 between switches 32 and 38 and is also linked to the common node (not numbered) between switches 33 and 39. In a similar fashion, input line 12 is linked to the common node between switches 34 and 40 and also to the common node between switches 35 and 41 while line 16 is linked to the common node between switches 30 and 36 and to the common node between switches 31 and 37. In FIG. 1a (and also FIG. 1b described below) switch emitters, collectors and gates are identified via E, C and G labels, respectively, with the collectors and emitters of switches 30 and 36 qualified by "1" and "2" sub-labels (e.g., E1, E2, C1, C2), to distinguish those emitters and collectors for additional explanation below.

A control bus 48 which represents a plurality of different control lines links controller 22 separately to each one of the rectifier switches 30–41 for independent control. Controller 22 controls when each of the switches 30–41 turns on and when each of the switches 30–41 turns off. Control schemes that may be used by controller 22 to convert the three-phase voltages on lines 12, 14 and 16 to a DC potential across DC buses 18 and 20 are well known in the conversion art and therefore will not be described herein detail. Rectifier legs that have their common nodes (e.g., 46) linked to the same input line are controlled in an identical fashion by controller 22. For example, referring still to FIG. 1a, each of switches 32 and 33 would be turned on and turned off at the same time by controller 22 and each of switches 38 and 39 would be turned on and turned off at the same times by controller 22 as the corresponding rectifier legs have the same common node 46 linked to line 14.

In addition to the components described above, the rectifier configuration illustrated in FIG. 1a also includes capacitors between DC buses 18 and 20 which are collectively identified by numeral 50. Although only two capacitors are illustrated, it should be appreciated that a larger number of capacitors would typically be employed in any type of rectifier configuration. Capacitors 50 reduce the ripple in the potential between lines 18 and 20 as well known in the art.

Figure 1B:
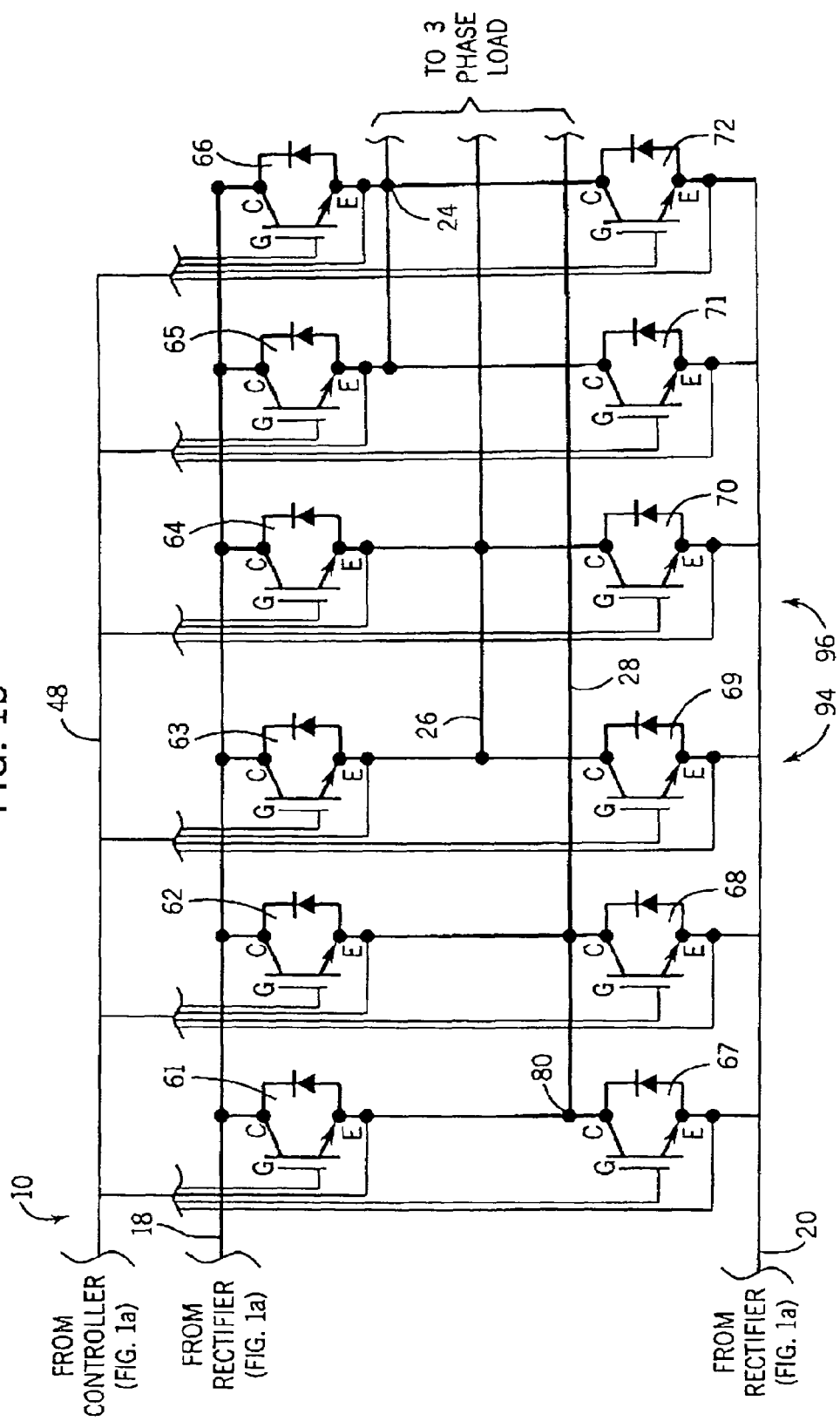
FIG. 1b is a schematic diagram of an inverter configuration.

Referring now to FIG. 1b, the inverter configuration illustrated, like the rectifier configuration of FIG. 1a, includes twelve separate switching devices identified by numerals 61–72. The switching devices 61–72 are arranged to form six separate inverter legs. Each inverter leg includes a pair of the switching devices 61–72 that is series arranged between the positive DC bus 18 and the negative DC bus 20. For example, a first inverter leg includes switches 61 and 67 series arranged between buses 18 and 20, a second inverter leg includes switches 62 and 68 series arranged between buses 18 and 20, a third leg includes switches 63 and 69 series arranged between buses 18 and 20, and so on.

Common nodes between inverter leg switch pairs are referred to hereinafter as common nodes. In FIG. 1b, an exemplary common node between switches 61 and 67 is identified by numeral 80. In the illustrated embodiment, each output line 24, 26 and 28 is linked to two separate inverter leg common nodes (e.g., 80). For example, output line 28 is linked to common node 80 between switches 61 and 67 and is also linked to the common node (not illustrated) between switches 62 and 68. Similarly, output line 26 is linked to the common node between switches 63 and 69 and also to the common node between switches 64 and 70 while output line 24 is linked to the common node between switches 65 and 71 and is also linked to the common node between switches 66 and 72.

The control bus 48 linked to controller 22 is also linked separate to each of the inverter switches 61–72 to independently control the turn on and turn off times of those switches. As in the case of the rectifier switches of FIG. 1a, controller 22 controls the switches of the inverter legs that have common nodes linked to the same output line in an identical fashion. To this end, referring still to FIG. 1b, because the common nodes (e.g., 80) corresponding to the first inverter leg including switches 61 and 67 and the second inverter leg including switches 62 and 68 are both connected to output line 28, the first and second inverter legs are controlled in a similar fashion so that each of switches 61 and 62 is turned on and turned off at the same times and each of switches 67 and 68 are turned on and off at the same times.

Referring to FIGS. 1a and 1b, the rectifier-inverter configuration includes commonly controlled switches so that the configuration can handle relatively high currents that may otherwise destroy the types of devices employed to configure the converters. In this manner relatively less expensive switches can be used to construct the converter assembly. The switches 30–41 used to configure the rectifier are typically identical and the switches 61–72 used to configure the inverter are typically identical. Depending on the configuration design, switches 30–41 may or may not be identical to switches 61–72.

Referring still to FIGS. 1a and 1b, switch manufacturers often provide power switching devices in prepackaged modules suitable to construct inverters and rectifiers. To this end, often, a complete 6-switch bridge will be provided as a separate and unique switching power package. Hereinafter it will be assumed that the 24 switches that comprise the rectifier and inverter in FIGS. 1a and 1b are provided in four separate 6-switch bridge packets where the first switching package includes switches 30, 31, 32, 36, 37 and 38, the second switch package includes switches 33, 34, 35, 39, 40 and 41, the third switch package includes switches 61, 62, 63, 67, 68 and 69 and the fourth switch package includes switches 64, 65, 66, 70, 71 and 72. Unless indicated otherwise, hereinafter, the first, second, third and fourth switch packages will be identified by numerals 90, 92, 94 and 96, respectively. Exemplary switch packets 90, 92, 94 and 96 are illustrated in FIG. 2 and are described in greater detail below.

Figure 2:
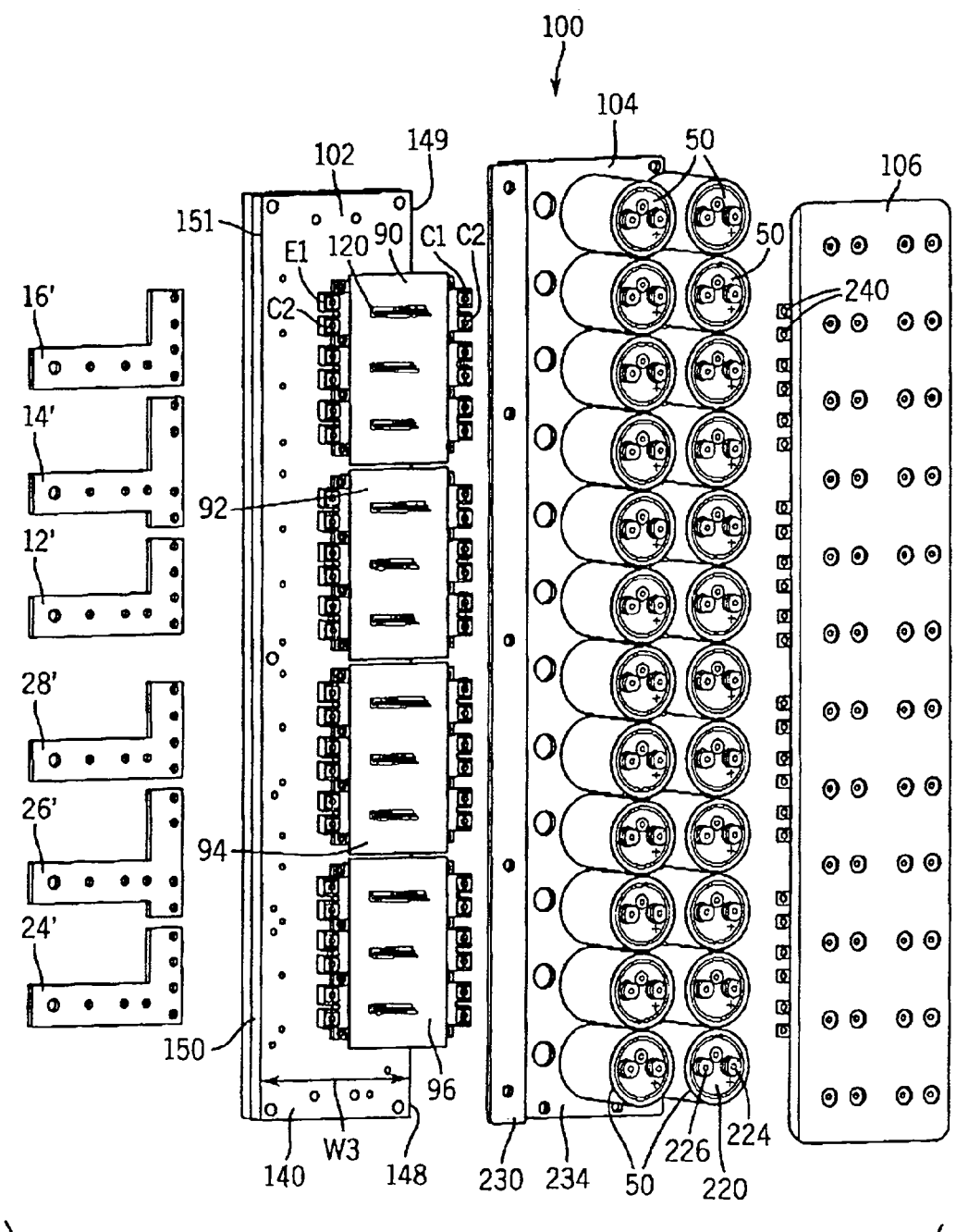
FIG. 2 is an exploded perspective view of a converter assembly according to one embodiment of the present invention.

Referring now to FIG. 2, an exploded perspective view of an exemplary rectifier/inverter converter assembly 100 is illustrated. Configuration 100 includes a heat sink member 102, the four-switching modules 90, 92, 94 and 96 briefly described above, a bracket member 104, a plurality of capacitors collectively identified by numeral 50, a laminated bus bar 106 and a plurality of input and output bus bars identified by numerals 12', 14', 16', 28', 26', and 24'.

Figure 3:
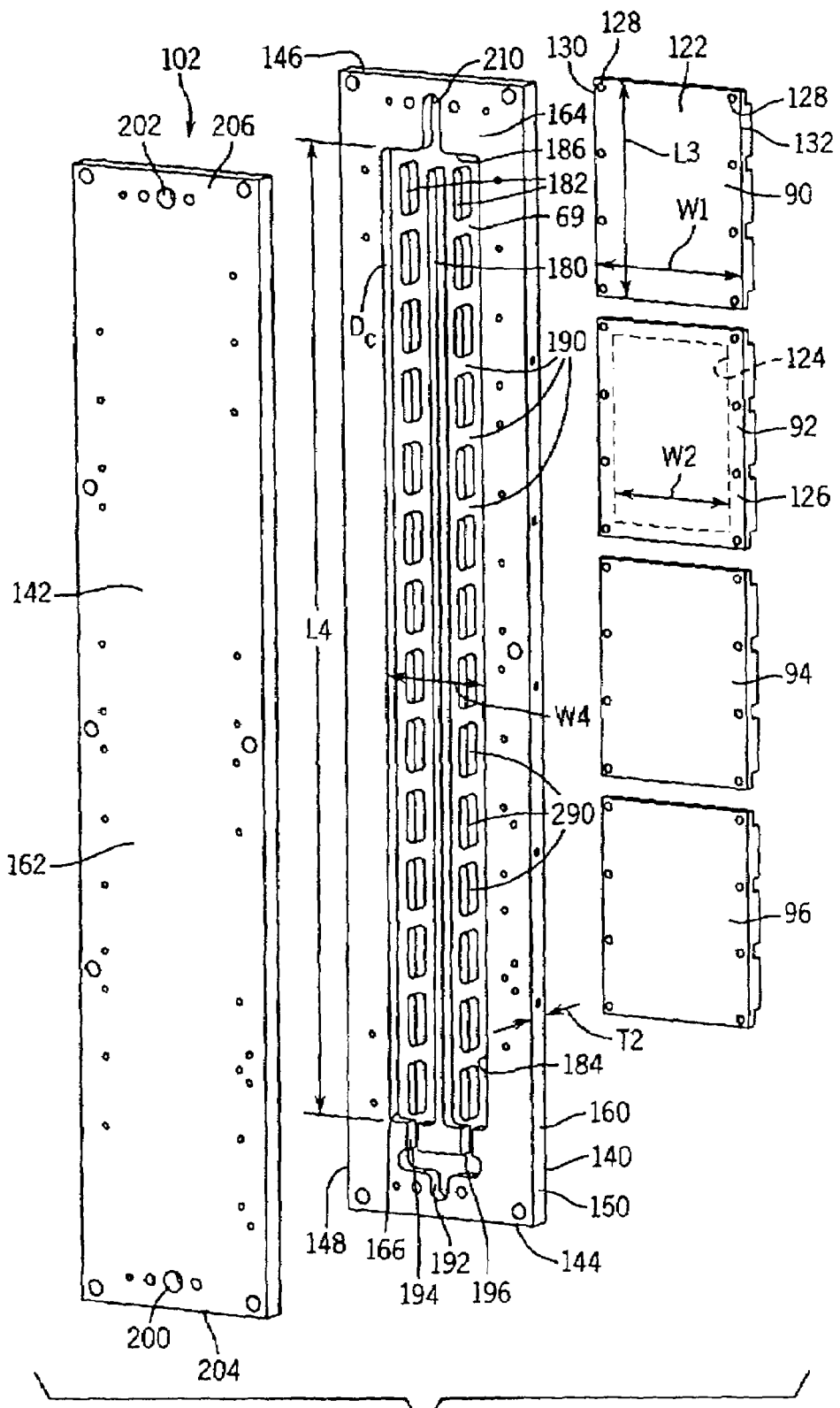
FIG. 3 is an exploded perspective view of the heat sink member and switch packages of FIG. 2.
Figure 5:
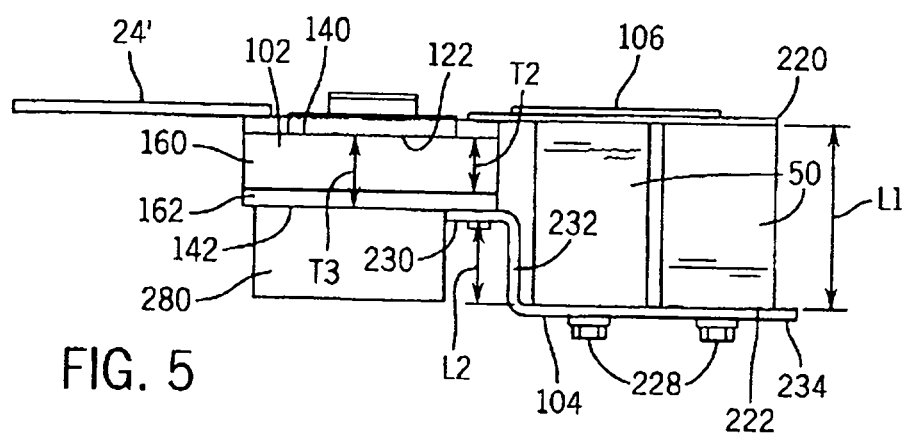
FIG. 5 is a bottom plan view of the conversion configuration of FIG. 4.

Each of switch packages 90, 92, 94 and 96 is similarly constructed and therefore, in the interest of simplifying this explanation, unless indicated otherwise, only switch package 90 will be described here in detail. Referring also to FIGS. 3 and 5, package 90 has a generally rectilinear shape having a length dimension L3, a width dimension W1 and a thickness dimension (not separately labeled). Although not illustrated in any of the drawings, device package 90 is characterized by a device thickness dimension that will be referred to herein by label T1 that is formed between the mounting or dissipating surface 122 (see FIG. 3) of the device and a connection plane defined by the top surfaces of the emitter and capacitor connection terminals that extend from the package housing. Package 90 has a first device or first linking edge 130 and a second device or second linking edge 132 that face in opposite directions and are separated by device width W1 as illustrated.

Referring still to FIG. 1a and also to FIG. 2, package 90 includes switching devices 30, 31, 32, 36, 37 and 38 that are arranged in a single row relationship where the emitters and collectors for each one of the switching devices extend from opposite side of package 90 and are generally separated by the device width W1. For example, the emitter E1 and collector C1 extend from opposite sides of package 90 while emitter E2 and collector C2 for switch 36 extend in opposite directions. Adjacent switches within package 90 have their emitters and collectors extending in different directions. For example, referring to FIG. 1a and FIG. 2, switch 36 in FIG. 1a has its emitter E2 and its collector C2 extending in directions opposite those of emitter E1 and collector C1 of the first switch 30 adjacent thereto in the package 90. Referring still to FIG. 3, package 90 is designed so that all of the emitter and collector terminals extend from the package housing within a single connection plane.

Hereinafter, unless indicated otherwise, switching device connection terminals that are linked to any of bus bars 12', 14', 16', 24', 26' or 28' will be referred to as inter-converter terminals because those terminals are connected through their respective bus bars to components outside the converter configuration. Similarly, any device package terminals that are linked to laminated bus bar 106 will be referred to hereinafter generally as intra-converter terminals as those terminals are linked to other components within the converter assembly.

Figure 4:
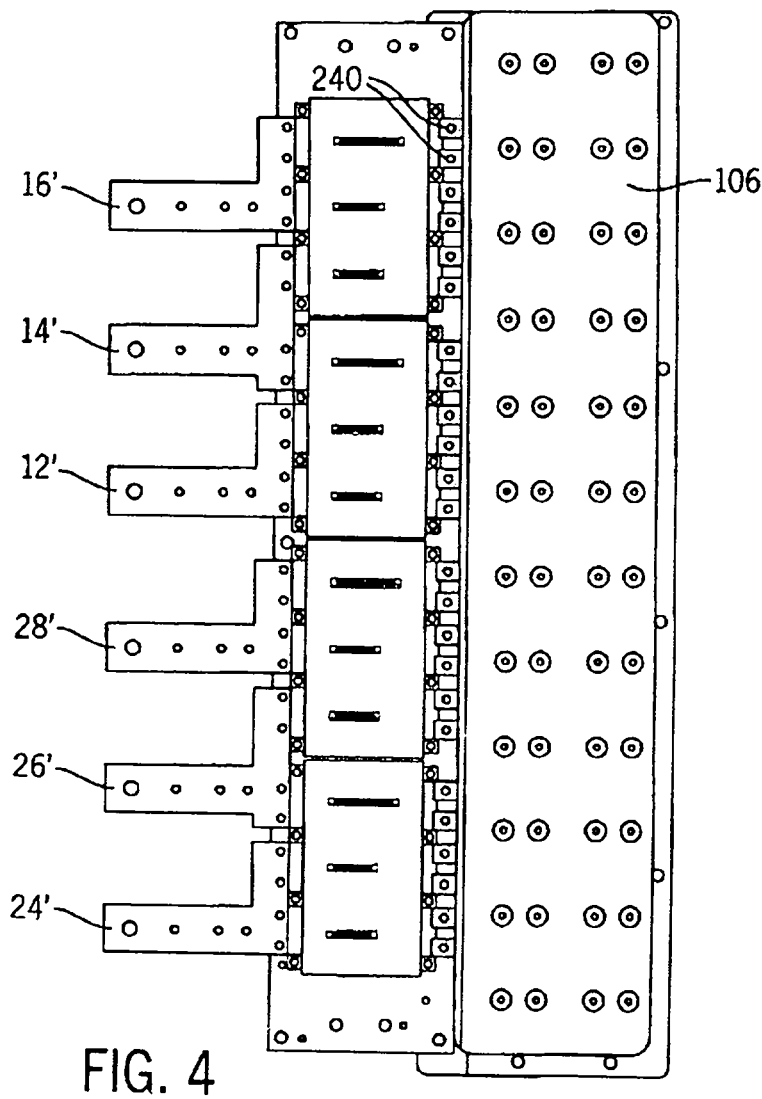
FIG. 4 is a side plan view of an assembled configuration consistent with FIG. 2.

As illustrated and described hereinafter, all of the inter-converter terminals extend from one side of package 90 while all of the intra-converter terminals extend from the opposite side of package 90 after the configuration in FIGS. 2 and 4 is assembled. In addition, after assembly, all of the intra-converter terminals for all of packages 90, 92, 94 and 96 extend in the same direction and form a connection line while all of the inter-converter terminals for packages 90, 902, 904 and 96 extend in the opposite direction and form a second connection line (see alignment generally in FIG. 2). The first and second connection lines form linking edges of the devices in the packages.

Control ports are provided on a top surface of package 90 to facilitate linking of control bus 48 to the devices provided within package 90. An exemplary control port in FIG. 2 is identified by numeral 120.

Package 90 has an undersurface 122 that is in thermal contact with the components inside the package housing that generate heat. Package 90 is designed so that surface 122 is substantially flat and can make substantially full contact with a heat sink surface when mounted thereto. It should be appreciated that, typically, only a portion of surface 122 may generate a relatively large percentage of the total amount of heat generated by the package and that the primary heat generating surface will likely be the central portion of surface 122. A heat generating segment 124 or dissipating surface of package 92 is illustrated and includes a space that is framed by an outer space or framing portion 126 that surrounds the heat generating space 124. Space 124 generally corresponds to a space that is in direct contact with the package 90 components that conduct current and hence generate heat. Space 124 has a dissipating surface width dimension W2 associated therewith.

As best in seen in FIGS. 2 and 3, each package 90 includes a plurality of small apertures, two of which are identified by number 128, provided through the outer space 126 that frames the heat generating segment 124 (e.g., see device 92) as illustrated. Apertures 128 are provided to facilitate mounting packages 90, 92, 94 and 96 to sink member 102.

Referring still to FIG. 2, bus bars 12', 14', 16,' 28', 26' and 24' are to be linked to input lines 12, 14, 16 and output lines 28, 26 and 24 in FIGS. 1a and 1b, respectively. The linking relationship between bus bars and associated lines is highlighted by the bus bars being labeled with numbers that are identical to the line numbers to which they connect followed by a "'" indicator.

Each of input and output bus bars 12', 14', 16', 24', 26' and 28' are simply steel bars that either have an "L" shape or a "T" shape. Each bar 12', 14', 16', 24', 26' and 28' is designed to link input or output lines to a subset of four of the inter-converter terminals. For example, referring to FIGS. 1a and 2, L-shaped bus bar 16' is constructed and dimensioned so as to link together each of the emitter E1 for switch 30, the collector C2 for switch 36, the emitter for switch 31 and the collector for switch 37 and, to this end, includes four separate apertures for receiving some type of mechanical securing component (e.g., a bolt), a separate aperture corresponding to each one the emitters and collectors to be connect by bar 16'. Each of the other bus bars 12', 14', 24', 26' and 28' has a construction similar to bus bar 16' and therefore, in the interest of simplifying this explanation, the other bars will not be described here in detail. It should suffice to say that the bus bars link emitters and collectors among the switch packages 90, 92, 94 and 96 in a manner that is consistent with the schematics illustrated in FIGS. 1a and 1b.

Referring once again to FIG. 3 and also to FIG. 4, heat sink member 102 is an elongated and, in the illustrated embodiment, substantially rectilinear metallic (e.g., aluminum, copper, etc.) member that extends from a first end 144 to a second end 146, has first and second lateral surfaces 148 and 150, respectively, that face in opposite directions and extend along the entire length between ends 144 and 146 and also includes a first or first mounting surface 140 and a second oppositely facing mounting surface 142. As best illustrated in FIG. 2 (and also illustrated in FIG. 6), mounting surface 140 has a width dimension W3 that separates the lateral surfaces 148 and 150, respectively and has a length dimension L5. Mounting surface 140 and lateral surfaces 148 and 150 form first and second lateral edges 149 and 151, respectively. In at least one embodiment of the present invention, sink width W3 is substantially similar to the device package width W1 so that, as illustrated in FIG. 2, device packages 90, 92, 94 and 96 are mounted in a side-by-side single row fashion to be accommodated on mounting surface 140.

As best seen in FIG. 3, in at least one embodiment, sink member 102 includes two separate components that are secured together. The two components including a body member 160 and a cover member 162. Referring also to FIG. 5, body member 160 has thickness dimension T2 which is generally greater than the thickness dimension (not separately identified) of member 162. Together, body member 160 and cover member 162 have a thickness dimension T3.

Figure 6:
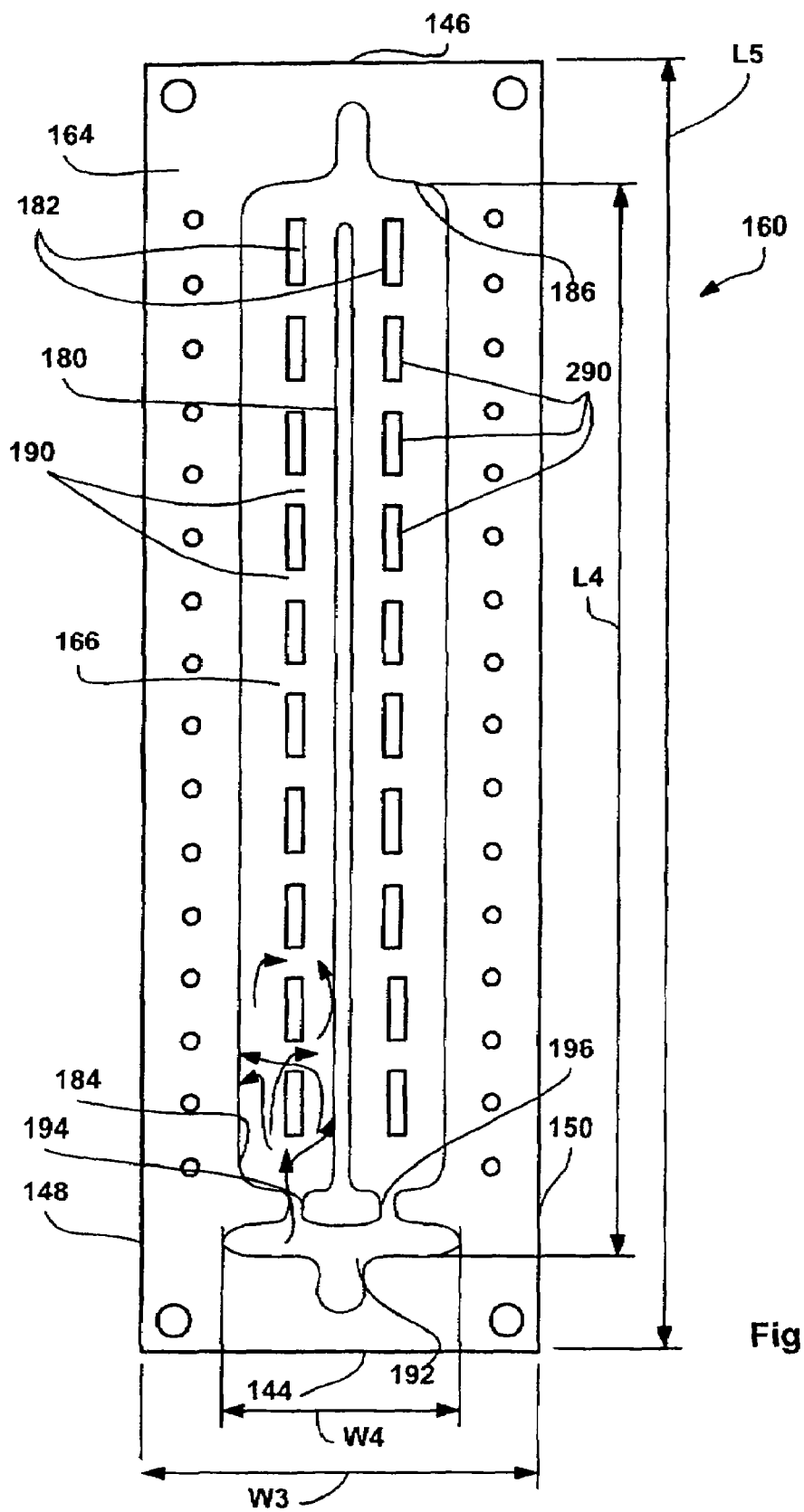
FIG. 6 is a plan view of the body member of the heat sink member of FIG. 3 and, in particular, showing the surface of the body member in which a coolant channel is formed.

As illustrated in FIGS. 3 and 6, body member 160 includes a second surface 164 opposite mounting surface 140 and forms a cavity 166 therein which extends substantially along the length of body member 160 from the first end 144 of the sink member to the second end 146. Cavity 166 has a cavity or channel depth Dc and forms a cavity or channel surface 69. In the illustrated embodiment, cavity 166 stops short of each of the ends 140 and 146, has a cavity length dimension L4 and has a cavity width or receiving dimension W4. Channel walls are provided on opposite sides of cavity 166 that have a thickness that is similar to the width dimension of the framing (i.e., the mounting flange) portion 126 of device surface 122 (see FIG. 3). The cavity width dimension W4, in at least some embodiments, is similar to the width dimension W2 of the primary heat generating portion or segment 124 of the package dissipating surface 122.

Cavity length dimension L4, in some embodiments, is substantially similar to a dimension formed by the oppositely facing edges of the dissipating surfaces of the device packages at the ends of the device row attached to the sink member. This dimension will be slightly smaller than the combined lengths (e.g., L3) of the device packages 90, 92, 94 and 96 in most cases. When cavity 160 is so dimensioned, a relatively small sink assembly is constructed which still provides effective cooling to devices attached thereto.

Referring still to FIGS. 3 and 6, within cavity 166, body member 160 includes three separate cavity dividing members including a central or first dividing member 180 and second and third lateral dividing members collectively identified by numeral 182. As its label implies, central dividing member 180 is positioned centrally within cavity 166 and generally divides the cavity into two separate channels. Central dividing member 180, in the illustrated embodiment, extends such that its distal end is flush with surface 164 of body member 160. In addition, central dividing member 180 extends all the way to a first end 184 of cavity 166 but stops short of a second end 186 of the cavity, the second end 186 being opposite first end 184.

Each of the second and third dividing members 182 is positioned on a different side of central member 180 and each stops short of both the first cavity end 184 and the second cavity end 186. In addition, each of dividing members 182 forms a plurality of openings so that liquid flowing on either side of the member can pass to the opposite side of the member. Exemplary openings are identified by numeral 190 in FIG. 3. Like central member 180, in the illustrated embodiment, each of the second and third lateral members 182 extends such that its distal end is flush with surface 164 of body member 160.

With openings 190 formed in each of dividing members 182, what remains of members 182 includes protuberances 290 that essentially break up the flow of coolant through the two channels formed within the cavity 166 as described in greater detail below. In the illustrated embodiment the protuberances 290 are essentially equi-spaced along the channel lengths.

At the first end 144 of the sink member, in the illustrated embodiment, body member 160 forms an inlet or receiving chamber 192 and first and second nozzle passageways 194 and 196, respectively. Inlet chamber 192 is formed between end 144 and cavity 166 and is connected to cavity 166 on one side of central member 180 by first nozzle passageway 194 and is connected to cavity 166 on the other side of central dividing member 180 by second nozzle passageway 196. Inlet chamber 192 has a relatively large cross-sectional area when compared to either of nozzle passageways 194 and 196 so that inlet chamber 192 can act as a reservoir for providing liquid under pressure to cavity 166 through the nozzle passageways 194 and 196. In the illustrated embodiment, each of the second and third lateral dividing members 182 is positioned such that the protuberance 290 closest to the inlet nozzle passageway 194 or 196 is aligned therewith. At second end 146 of body member 160, body member 160 forms a channel extension 210 having a width dimension that is less than the cavity width W4.

Body member 160 can be formed in any manner known in the art. One method for providing member 160 includes providing the member without cavity 166 and scraping metal out of surface 164 to provide a suitable cavity. Another method may be to form body member 160 in a mold. Other manufacturing processes are contemplated.

Cover member 162 is a substantially planar and rigid rectilinear member having a shape which mirrors the shape of surface 164. Member 162 forms an inlet opening 200 at a first end 204 and an outlet opening 202 at a second 206. The inlet 200 and outlet 202 are formed such that, when cover member 162 is secured to surface 164, inlet 200 opens into inlet channel 192 and outlet 202 opens into extension 210.

To secure cover member 162 in a hermetically sealed manner to surface 164, any method known in the industry can be employed. One method which has been shown to be particularly useful in providing a hermetic seal between cover member 162 and body member 160 has been to use a vacuum brazing technique where a bead of brazing material is provided along surface 164 of body member 160, cover member 162 is provided on surface 164 with the brazing bead sandwiched between members 162 and 160 and then the component assembly is subjected to extremely high heat thereby causing a brazing function to occur. Other securing methods are contemplated.

As illustrated, each of body member 160 and cover member 162 form a plurality of apertures (not separately numbered) for receiving mechanical components such as screws, bolts, etc., for mounting device packages 90, 92, 94 and 96 and, perhaps, other electronic devices, to the sink member 102. In addition, body member 160 and/or cover member 162 may include other apertures for mounting other converter components (e.g., the bracket described below) to sink member 102 and/or to mount the sink member 102 within a converter housing for support.

Referring once again to FIG. 2 and also to FIG. 5, capacitors 50 are standard types of capacitors and, to that end, generally include a cylindrical body member having a first end 220 and a second end 222 opposite the first end 220 where terminals 224 and 226 extend from each first end 220 and a heat conducting extension 228 (see FIG. 5) extends centrally from each second end 222. The heat conducting extensions 228, as the label implies, conducts most of the heat from the central core of the capacitor. Each capacitor 50 has a length dimension L1 which separates the first and second ends 220 and 222.

Referring now to FIGS. 2, 4 and 5, bracket member 104 is, in at least one embodiment, formed of a heat conducting, rigid material such as aluminum or copper. Bracket member 104 includes a proximal member 230, an intermediate member 232 and a distal member 234. Proximal member 230 includes a flat elongated member which has a length substantially equal to the length of sink member 102. Proximal member 230 forms a plurality of mounting apertures along its length which align with similar apertures (not illustrated) in the surface 142 formed by cover member 162 (see again FIG. 3).

Intermediate member 232 forms a 90° angle with proximal member 230 and extends from one of the long edges of member 230. Similarly, distal member 234 extends from the long edge of intermediate member 232 opposite the edge linked to proximal member 230 and forms a 90° angle with intermediate member 232. The 90° angle formed between intermediate member 232 and distal member 234 is in the direction opposite the angle formed between proximal member 230 and intermediate member 232 so that distal member 234 extends, generally, in a direction opposite the direction in which proximal member 230 extends. Although not illustrated, distal member 234 forms a plurality of apertures through which the heat dissipating capacitor extension members 228 extend for mounting the capacitors 50 thereto. In the illustrated embodiment, distal member 234 forms two rows of substantially equi-spaced apertures for receiving the capacitors 50 and arranging the capacitors 50 in two separate rows.

Referring again to FIGS. 2, 4 and 5, laminated bus bar 106 includes a substantially planar member having a general shape similar to the shape of distal member 134. Although not illustrated, it should be appreciated by one of ordinary skill in the art that laminated bus bar 106 includes several metallic conducting layers where adjacent layers are separated by insulating layers and wherein different ones of a conducting layers are linked to connecting terminals along one edge of the bus bar. Exemplary connecting terminals are identified by numeral 240 in FIGS. 2 and 4.

In addition, although not illustrated, separate vias are provided in an underside of bus bar 106 which facilitate connection of particular points and particular conducting laminations within bar 106 to the capacitors juxtaposed hereunder when the converter assembly is configured. More specifically, referring to FIGS. 1a and 1b once again, bus bar 106 links various emitters and collectors of the switching devices 30–41 and 61–72 to the positive and negative DC buses separated by the capacitors 50 as illustrated. Thus, for example, bus bar 106 links the collector of switch 30 to the positive DC bus 18, the emitter of switch 36 to the negative DC bus, the collector of switch 31 to the positive DC bus 18, the emitter of switch 37 to the negative DC bus 20, and so on.

It should be appreciated that bus bar 106 can have an extremely simple and hence minimally expensive construction when used with a sink and switching device configuration that aligns all intra-converter connection terminals in a single line and in a single connection plane. Here only a minimal number of laminate layers are required and no vias are required to link to the switching devices as connection terminals 240 are within the same plane as the device terminals.

With the converter components configured as described above, a particularly advantageous converter assembly can be assembled as follows. First, after the cover member 62 has been hermetically sealed to body member 160, device packages 90, 92, 94 and 96 are mounted to mounting surface 140 of sink member 102 so as to form a single device row as illustrated best in FIG. 4. Next, bracket member 104 is secured to surface 142 of cover member 102 so that intermediate member 232 generally extends away from sink member 102 and so that distal member 234 also extends generally away from sink member 102. Capacitors 50 are next mounted to distal member 234 with their extending heat dissipating extensions 228 passing through apertures in member 234 and so that the capacitors 50 form two capacitive rows as illustrated in FIGS. 2 and 5.

At this point, it should be appreciated that, when bracket member 104 is suitably dimensioned, the connection terminals 224 and 226 that extend from the first ends 220 of the capacitors 50 should be within the same connection plane as the intra-converter connection terminals extending toward the capacitors 50 from each of device packages 90, 92, 94 and 96. To this end, the bracket member 232 should be chosen such that the length dimension L2 of intermediate member 232, when added to the sink member thickness T3 and the device thickness T1 (not illustrated), essentially equals the capacitor length L1. When any of the sink member 102, the capacitors 50 or the device packages (e.g., 90) are replaced by other components having different dimensions, the differently dimensioned components can be accommodated and the capacitor and device package connecting terminals can be kept within the same plane by selecting a bracket member 104 having a different intermediate member 232 length dimension L2. Thus, the bracket-sink member assembly renders the sink member extremely versatile when compared to previous sink configurations that required multi-plane serpentine coolant paths.

With the capacitor connecting terminals and the intra-converter terminals extending from the device packages within the same connection plane, planar and relatively simple bus bar 106 is attached to the capacitor and intra-converter terminals thereby linking the various terminals to the positive and negative buses 18 and 20 in the fashion illustrated in FIGS. 1a and 1b above.

Continuing, the input and output bus bars 12', 14', 16', 24', 26' and 28' are next linked to the inter-converter connection terminals as illustrated in FIG. 4 and to link the emitters and capacitors of the switching devices 30–41 and 61–72 at the common nodes (e.g., 46, 80, etc.) as illustrated in FIGS. 1a and 1b.

Referring now to FIG. 5, when all of the components described above are secured together in the manner taught, an extremely compact converter assembly that requires a relatively small volume is configured. In fact, as illustrated, a space 280 is formed adjacent surface 142 of cover member 162 and adjacent intermediate member 232 where additional components such as the components required to configure controller 22 can be mounted. In some embodiments, at least some of the components of controller 22 will be mounted within cooling space 280 to a second mounting surface formed by surface 142 of cover member 162 so that the mounted components dissipate heat into sink member 102.

Referring again to FIGS. 3 and 6, with cover member 162 secured to surface 164, when liquid is pumped through inlet 200 and into inlet chamber 192, after chamber 192 fills with liquid, the liquid is forced through each of restricted nozzle inlets 194 and 196 into opposite sides of cavity 166 (i.e., into different halves of cavity 166 where the halves are separated by central dividing member 180). Because the nozzle passageways 194 and 196 are restricted, the coolant is forced therethrough under pressure which should overcome any pressure differential that exists within the opposite sides of cavity 166. As the liquid passes through cavity 166 on its way to and out outlet 202, the liquid heats up between first channel end 184 and second channel end 186 and a phase change occurs wherein at least a portion of the liquid, as heat is absorbed, changes from the liquid state the state gas thereby forming bubbles within cavity 166.

Protuberances 290 cause excessive amounts of turbulence within cavity 166 as the protuberances 290 redirect liquid along random trajectories within the channels. The excessive turbulence within cavity 166 is such that essentially no gas pockets form on the internal surfaces of the cavity 166 or the portion of cover member 162 enclosing cavity 166. In embodiments where sink member 102 is vertically aligned, bubbles that form within the cavity float upward under the force of liquid flow and the force of their own buoyancy. The bubbles proceed out the outlet 202 and are thereafter condensed by the cooling system attached thereto as the refrigerant is cooled.

In FIG. 6, as indicated above, cavity 166 has a width dimension W4 that is, at least in one embodiment, similar to the width dimension W2 of the heat generating portion of device or package surface 122 (see also FIG. 3). Where dimension W2 is smaller, it is contemplated that the dual channel aspect of cavity 166 may not be required. For example, assume dimension W2 is half the dimension illustrated in the figures. In this case, the cavity 166 may be made approximately half the illustrated dimension and hence central member 180 may not be needed.

Experiments have shown that if width dimension W4 is too large and no dividers 180 are provided along the cavity length L4, the turbulence generated by the protuberances 290 is substantially reduced. Thus, for instance, assume member 180 were removed from cavity 166. In this case much of the coolant pumped into cavity 166 through passageways 194 and 196 would pass relatively calmly through to the outlet end 186 of cavity 166. The maximum width of each channel formed within cavity 166 is going to be a function of various factors including cavity depth, coolant employed, coolant pressure, the quantum of heat generated by device packages mounted to the sink, etc.

It should be appreciated that the protuberances 290 and divider 180 within cavity 166 are specifically provided to increase channel turbulence to a level that eliminates gas pockets on channel surfaces. Without gas pockets on the channel surfaces, refrigerant/coolant is in substantially full contact with all channel surfaces and the temperature differential between the first and second channel ends 184 and 186 is substantially reduced. The smaller channel temperature differential means that devices mounted to sink member 102 have more similar operating characteristics as desired.

Figure 9:
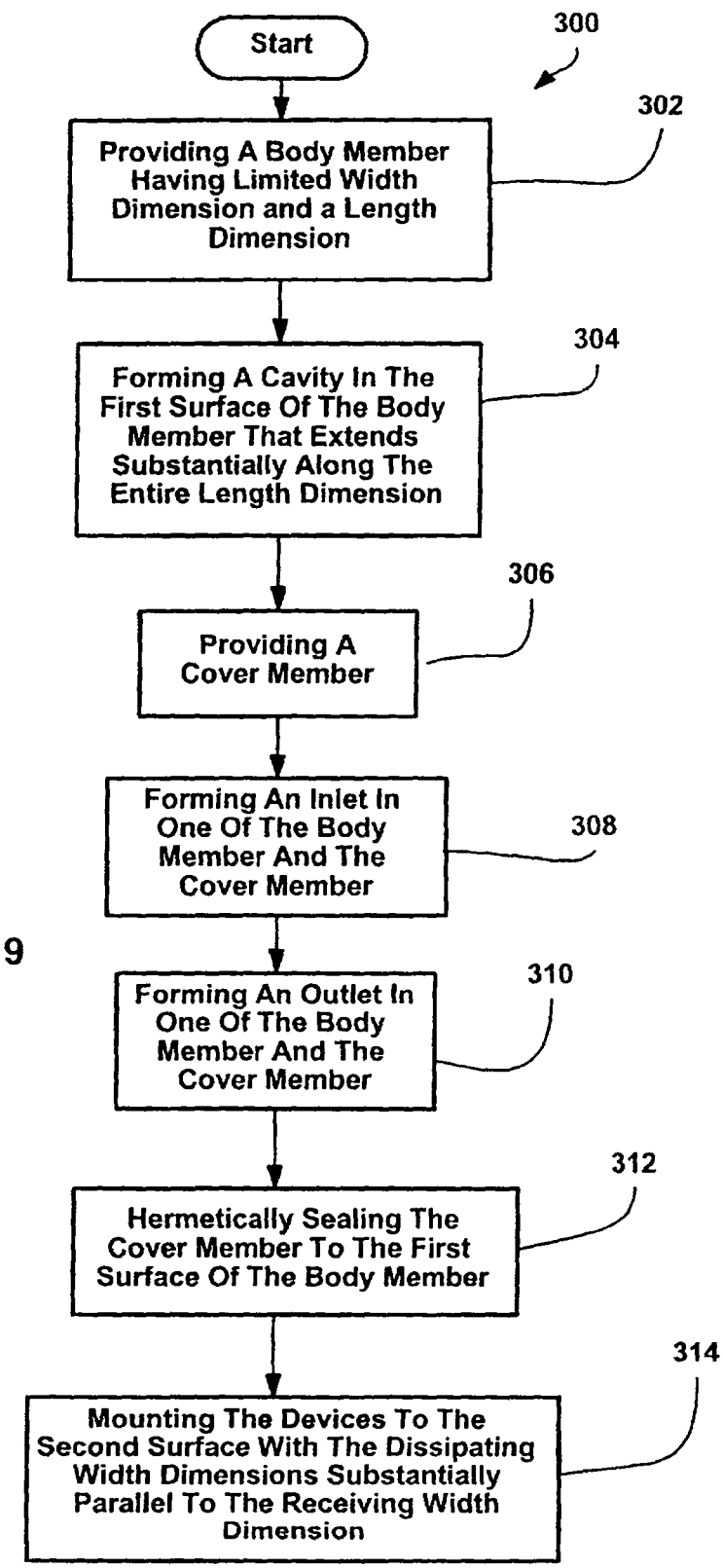
FIG. 9 is a flow chart according to one aspect of the present invention.

Referring now to FIG. 9 a method 300 according to one aspect of the present invention is illustrated. Here, at block 302, a body member 160 (see again FIG. 3) having a limited width dimension W3 and a length L5 is provided where the limited width dimension is substantially similar to or identical to the width dimension W1 of the devices to be attached thereto. At block 304, a cavity is formed in a first surface of the body member 160 that extends substantially along the entire length dimension L5. The cavity is illustrated as 166 in FIG. 3. At block 306, a cover member 162 is provided that is consistent with the teachings above. At block 308 an inlet is formed in one of the body member and the cover member. At block 310 an outlet is formed in one of the body member and the cover member. As above, the inlet and outlet formed should open into opposite ends of the cavity or channel 166. At block 312, the cover member 162 is hermetically sealed in any manner known in the art to the body member 160 thereby providing an enclosed channel having only a single inlet and a single outlet at opposite ends. Continuing, at block 314, power switching devices for packages 90, 92, 94 and 96 are mounted to the second or mounting surface with their dissipating width dimensions substantially parallel to the receiving width dimension W3 of the heat sink.

Figure 7:
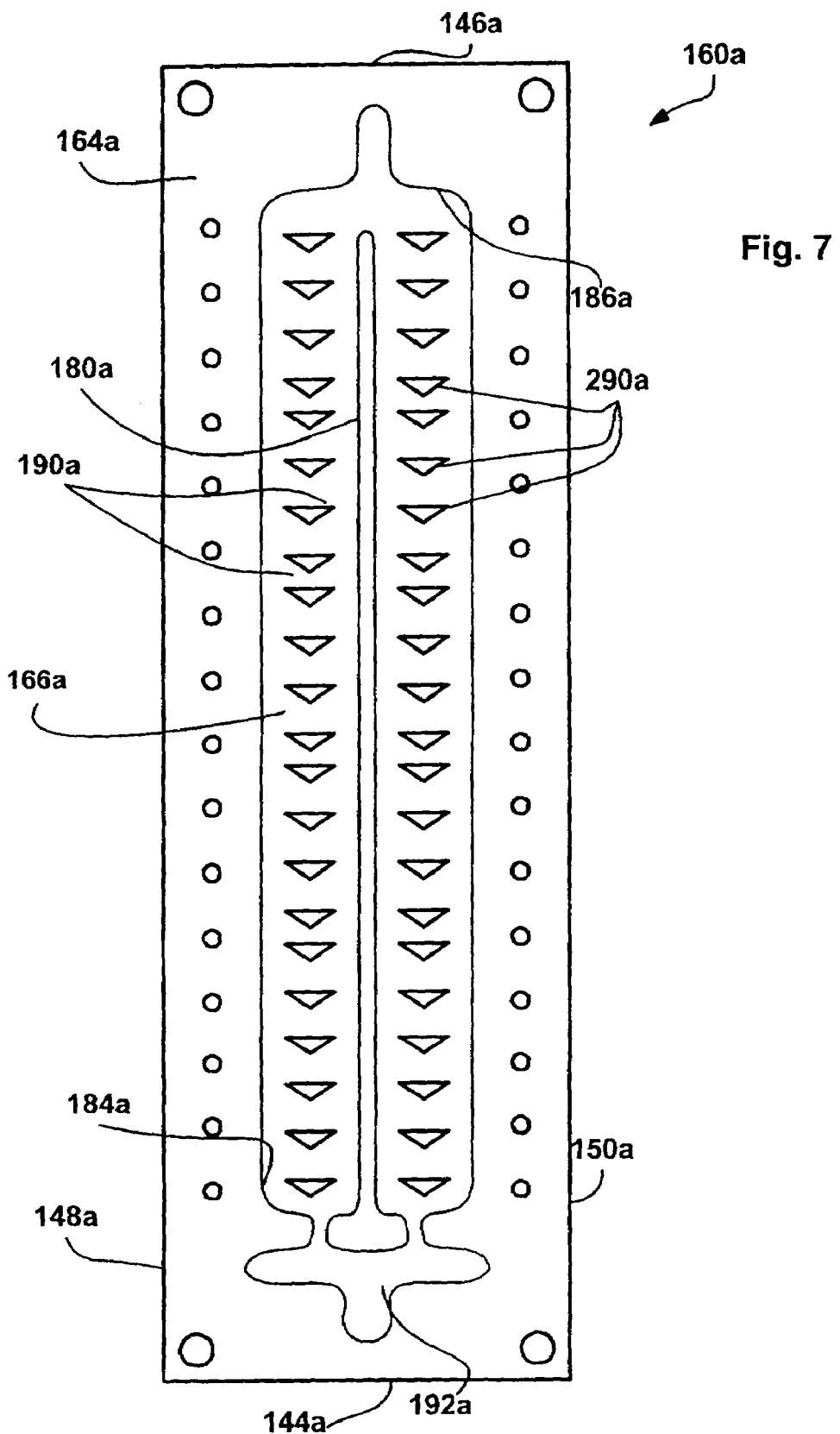
FIG. 7 is similar to FIG. 6, albeit illustrating a second embodiment of the body member.

It should be understood that the methods and apparatuses described above are only exemplary and do not limit the scope of the invention, and that various modifications could be made by those skilled in the art that would fall under the scope of the invention. For example, while the sink member 102 is described as being formed of two components other configurations are contemplated. In addition, the protuberances 290 may take other forms that cause a suitable amount of turbulence within the channel. For instance, in FIG. 7 another embodiment of the body member is illustrated. In FIG. 7 components similar to the components of FIG. 6 are identified by identical numbers followed by an "a" qualifier. In FIG. 7, instead of providing substantially rectilinear protuberances as in FIG. 6, triangular protuberances 290a are provided on either side of member 280. Moreover, the protuberances may be formed by any channel surface although forming the protuberances on the surface opposite the heat generating devices (i.e., opposite the mounting surface) increases the total surface area proximate the heat generating device that is in contact with the coolant. Furthermore, both the cover and the body member may form protuberances and, in some embodiments, the cover member may form part or all of the cavity 166.

In addition, while the protuberances 290 are illustrated as being equi-spaced, equi-spacing is not required and, in fact, it may be advantageous to provide protuberances that cause a greater amount of turbulence at the outlet end of the channel than at the inlet end as the coolant at the outlet end could be slightly warmer and hence could generate more problematic vapor bubbles.

Figure 8:
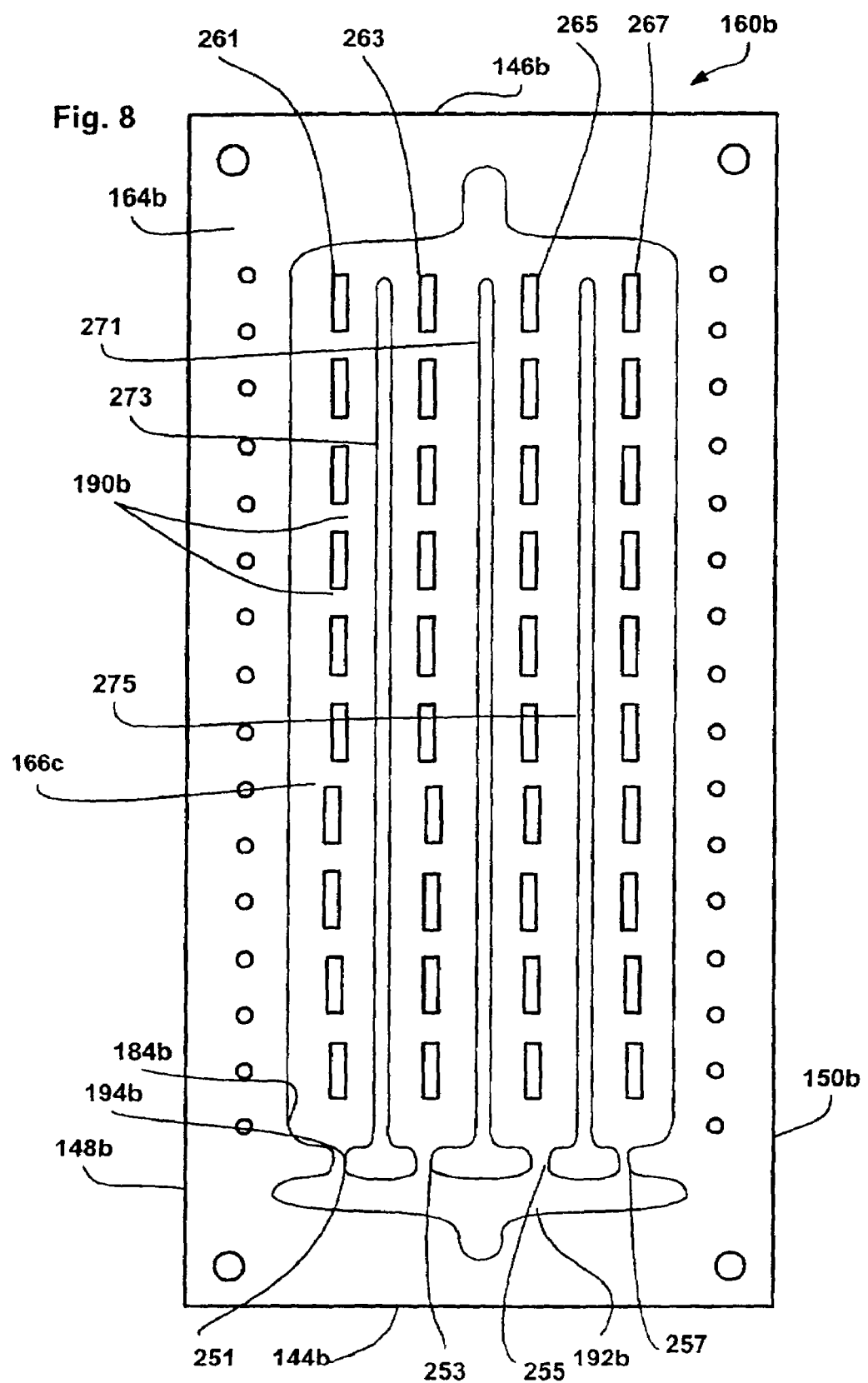
FIG. 8 is similar to FIG. 6, albeit illustrating yet one other embodiment of the body member.

Moreover, more than one divider may be provided in a cavity. In this regard, referring to FIG. 8, another inventive embodiment 160b of the body member is illustrated. In FIG. 8 components similar to components described above are identified by the same number followed by a "b" qualifier. In FIG. 8 cavity 166b is twice as wide as the cavity 166 in FIG. 6. Here, to ensure sufficient turbulence to eliminate stagnant gas pockets from the cavity surface, three separate divider members 271, 273 and 275 are provided that equally divide cavity 166b along its width. In addition, separate inlet passageways 251, 253, 255 and 257 are provided that open from inlet chamber 192c into each separate channel within cavity 166b and separate lines of protuberances 261, 263, 265 and 267 are formed within the separate channels. Thus, the protuberance concept has application in wider sink assemblies also although it is particularly advantageous in long sink assemblies for the reasons described above.

To apprise the public of the scope of this invention, the following claims are made:

What is claimed is:

1. An electronic converter assembly comprising:
   a liquid cooled heat sink member having a sink length dimension, at least one mounting surface and first and second oppositely facing lateral surfaces, the mounting surface and first and second lateral surfaces forming first and second lateral edges, respectively, the sink member also forming at least one internal channel that extends substantially along the entire sink length, an inlet and an outlet that open into opposite ends of the channel;
   a plurality of power switching devices mounted side by side to the mounting surface thereby forming a single device row that extends substantially along the sink length, each device including intra-converter terminals that are substantially within a single connection plane;
   a plurality of capacitors, each capacitor including capacitor connection terminals, the capacitors linked for support to and adjacent the sink member with the capacitor terminals juxtaposed substantially within the connection plane; and
   a linkage assembly including a plurality of conductors that link the capacitor terminals to the intra-converter terminals to form a power conversion topology.

2. The apparatus of claim 1 wherein each power switching device includes first and second oppositely facing linking edges and wherein the intra-converter terminals form the first linking edge proximate the first lateral edge of the sink member.

3. The apparatus of claim 1 further including a bracket member mounted to the sink member and extending past the first surface, the capacitors mounted to the bracket member for support.

4. The apparatus of claim 3 wherein the mounting surface is a first mounting surface and the sink member includes a second mounting surface that faces in a direction opposite the first mounting surface and wherein the bracket member is mounted to the second mounting surface.

5. The apparatus of claim 4 wherein the bracket member includes a proximate member mounted to the second mounting surface, an intermediate member linked to and forming a substantially 90 degree angle with the proximate member and extending substantially parallel to the first lateral side of the sink member and generally away from the sink member and a distal member forming a substantially 90 degree angle with the intermediate member and extending generally away from the sink member, the capacitors mounted to the distal member.

6. The apparatus of claim 5 wherein each of the devices includes a heat dissipating surface adjacent the mounting surface and is characterized by a device thickness dimension between the connection plane and the dissipating surface of the device, the first and second mounting surfaces are separated by a sink thickness, the intermediate member has an intermediate member length, each capacitor includes first and second oppositely facing ends and a length dimension between the first and second ends, the capacitor terminals extend axially from the first end of each capacitor and the second end of each capacitor is mounted to the distal member and, wherein, the combined sink thickness, device thickness and intermediate member length is substantially similar to the capacitor length dimension.

7. The apparatus of claim 6 wherein each capacitor has a heat conducting extension that protrudes from the second end of the capacitor and that is in conductive contact with the distal end of the bracket member.

8. The apparatus of claim 7 wherein the bracket member is formed of a heat conducting material.

9. The apparatus of claim 8 wherein the bracket is formed from one of aluminum and copper.

10. The apparatus of claim 8 wherein the linkage assembly includes a substantially planar laminated bus bar.

11. The apparatus of claim 1 wherein the linkage assembly links the capacitors and power switching devices together to form an inverter.

12. The apparatus of claim 11 wherein the linkage assembly links the capacitors and power switching devices together to also form a rectifier.

13. The apparatus of claim 2 wherein each device also includes inter-converter connection terminals that form the second linking edge and the inter-converter connection terminals are adjacent the second lateral edge of the sink member and wherein the inter-converter terminals are juxtaposed within the connection plane.

14. The apparatus of claim 2 wherein the first and second lateral edges of the mounting surface form a sink member width and wherein a device width between the first and second linking edges is substantially similar to the sink member width.

15. The apparatus of claim 1 wherein the channel inlet is disposed below the channel outlet.

16. The apparatus of claim 15 wherein the channel inlet is substantially directly vertically below the channel outlet.

17. The apparatus of claim 16 further including extension members that extend into the channel thereby increasing turbulence in liquid pumped from the inlet to the outlet.

18. The apparatus of claim 3 wherein the bracket member is integrally formed with the sink member.

19. The apparatus of claim 5 wherein a cooling space is formed adjacent both of the second mounting surface and the intermediate member and wherein drive control components are mounted to the second mounting surface.

20. An electronic converter assembly comprising:
a heat sink member having a sink length dimension, at least one mounting surface and first and second oppositely facing lateral surfaces, the mounting surface and first and second lateral surfaces forming first and second lateral edges, respectively;
a plurality of power switching devices mounted side by side to the mounting surface to form a single device row that extends along the sink length, each device including intra-converter terminals juxtaposed substantially within a single connection plane, each device also including first and second oppositely facing linking edges having a device width therebetween;
a bracket member mounted to the sink member and extending past the first lateral surface;
a plurality of capacitors, each capacitor including capacitor connection terminals, the capacitors mounted to the bracket member adjacent the sink member with the capacitor terminals substantially within the connection plane; and
a linkage assembly including a plurality of conductors that link the capacitor terminals to the intra-converter terminals to form a power conversion topology.

21. The apparatus of claim 20 wherein the sink member forms at least one internal channel that extends substantially along the entire sink length and an inlet and an outlet that open into opposite ends of the channel and, wherein, the converter configuration is juxtaposed so that the channel is substantially vertically oriented.

22. The apparatus of claim 21 wherein the channel inlet is substantially vertically below the channel outlet.

23. The apparatus of claim 22 wherein the mounting surface is a first mounting surface and the sink member includes a second mounting surface that faces in a direction opposite the first mounting surface, the bracket member is mounted to the second mounting surface, the bracket member includes a proximate member mounted to the second mounting surface, an intermediate member linked to and forming a substantially 90 degree angle with the proximate member and extending substantially parallel to the first lateral side of the sink member and generally away from the sink member and a distal member forming a substantially 90 degree angle with the intermediate member and extending generally away from the sink member, the capacitors mounted to the distal member.

24. The apparatus of claim 23 wherein each of the devices includes a heat dissipating surface adjacent the mounting surface and is characterized by a device thickness dimension between the connection plane and the dissipating surface of the device, the first and second mounting surfaces are separated by a sink thickness, the intermediate member has an intermediate member length, each capacitor includes first and second oppositely facing ends and a length dimension between the first and second ends, the capacitor terminals extend axially from the first end of each capacitor and the second end of each capacitor is mounted to the distal member and, wherein, the combined sink thickness, device thickness and intermediate member length is substantially similar to the capacitor length dimension.

25. The apparatus of claim 20 wherein the bracket member is formed from one of aluminum and copper.

26. The apparatus of claim 20 wherein the linkage assembly includes a laminated bus bar.

27. The apparatus of claim 20 wherein the linking assembly links the capacitors and power switching devices together to form both a rectifier and an inverter.

28. The apparatus of claim 20 wherein the first and second lateral edges of the mounting surface form a sink member width and wherein a device width is substantially similar to the sink member width.

29. An electronic converter assembly comprising:

a liquid cooled heat sink member having a sink length dimension and at least one mounting surface, the sink member forming at least one internal channel that extends substantially along the entire sink length and an inlet and an outlet that open into opposite ends of the channel; and a plurality of power switching devices mounted to the mounting surface;

wherein, the assembly is juxtaposed such that the inlet is substantially vertically below the outlet.

30. The assembly of claim 29 wherein the switching devices are mounted to the mounting surface in a single device row that extends generally parallel to the channel.

31. The assembly of claim 30 wherein at least a sub-set of the switching devices are linked together to form an inverter.

32. The assembly of claim 31 wherein at least a sub-set of the switching devices are linked together to form a rectifier.

* * * * *